US010499544B1

(12) United States Patent
Rahm et al.

(10) Patent No.: US 10,499,544 B1
(45) Date of Patent: Dec. 3, 2019

(54) THERMAL ENERGY DISSIPATION SYSTEMS AND METHODS

(71) Applicant: ARRIS Enterprises LLC, Suwanee, GA (US)

(72) Inventors: James K. Rahm, Allentown, PA (US); Jared M. Gordon, Hatfield, PA (US)

(73) Assignee: ARRIS Enterprises LLC, Suwanee, GA (US)

( * ) Notice: Subject to any disclaimer, the term of this patent is extended or adjusted under 35 U.S.C. 154(b) by 0 days.

(21) Appl. No.: 16/163,544

(22) Filed: Oct. 17, 2018

(51) Int. Cl.
*H05K 7/20* (2006.01)
*H05K 5/03* (2006.01)
*H05K 5/02* (2006.01)

(52) U.S. Cl.
CPC ....... *H05K 7/20409* (2013.01); *H05K 5/0226* (2013.01); *H05K 5/0247* (2013.01); *H05K 5/03* (2013.01); *H05K 7/20336* (2013.01)

(58) Field of Classification Search
CPC .................................................. B60R 16/0239
See application file for complete search history.

(56) References Cited

U.S. PATENT DOCUMENTS

| 7,701,714 | B2 | 4/2010 | Shabany | |
| 2010/0218797 | A1* | 9/2010 | Coyle, Jr. | H05K 7/026 136/243 |
| 2011/0277967 | A1 | 11/2011 | Fried et al. | |
| 2015/0354902 | A1* | 12/2015 | McDonald | F28D 15/0275 165/45 |

OTHER PUBLICATIONS

Wikipedia article; Heat Pipe, as downloaded Jun. 5, 2018. URL: https://en.wikipedia.org/wiki/Heat_pipe.
Van Es, Johannes, et al., "Bene$ts and Drawbacks of Using Two-Phase Cooling Technologies in Military Platforms". National Aerospace Laboratory NLR, No. 1, vol. 19, Mar. 8, 2013.
Calautit, John Kaiser S., et al., "Wind catcher with heat transfer devices: Scientific Diagram", Design and optimisation of a novel passive cooling wind tower, URL: ttps://www.researchgate.net/figure/Wind-catcher-with-heat-transfer-devices-left-heat-transfer-device-operation-right_fig1_306345989.

* cited by examiner

*Primary Examiner* — Hung V Ngo
(74) *Attorney, Agent, or Firm* — Lori Anne D. Swanson (57) ABSTRACT

A system includes a housing (105) or enclosure for electrical components. The housing can include a base (106) and a lid (107) pivotably coupled to the base by one or more hinges (108,109). One or more heat-generating electrical components situated within the housing. One or more heat transfer devices (301,302,303,304) couple the housing to a thermal energy sink (207). The heat transfer devices transfer thermal energy generated by the one or more heat-generating electrical components from the housing to the thermal energy sink, thereby increasing the thermal dissipation capability of the housing.

20 Claims, 9 Drawing Sheets

THERMAL ENERGY DISSIPATION SYSTEMS AND METHODS

BACKGROUND

Technical Field

This disclosure relates generally to electrical devices, and more particularly to thermal energy dissipation systems for electrical devices.

Background Art

Electrical components are generally disposed within a housing of some sort for physical protection. Electrical components frequently generate heat. The heat dissipation properties of such housings and enclosures are frequently limited. This is especially true where the housing is sealed so as to be weatherproof. Such housings have a defined volume and surface area. These physical attributes define a limited capability to dissipate thermal energy generated therein by the electrical components.

Where the heat generated by the electrical components exceeds this limited capability, high internal and surface temperatures will result. High temperatures can reduce the reliability of the electrical components. Additionally, these high temperatures may increase costs due to additional service failures and replacement needs. It would be advantageous to have improved thermal energy dissipation systems and methods for these enclosures.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present disclosure.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

DETAILED DESCRIPTION OF THE DRAWINGS

Embodiments of the disclosure are now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on." Relational terms such as first and second, top and bottom, and the like may be used solely to distinguish one entity or action from another entity or action without necessarily requiring or implying any actual such relationship or order between such entities or actions.

As used herein, components may be "thermally coupled" when information can be sent between such components, even though there may be one or more intermediate or intervening components between, or along the thermally conductive connection path. The terms "substantially" and "about" are used to refer to dimensions, orientations, or alignments inclusive of manufacturing tolerances. Thus, a "substantially orthogonal" angle with a manufacturing tolerance of plus or minus two degrees would include all angles between 88 and 92, inclusive. Also, reference designators shown herein in parenthesis indicate components shown in a figure other than the one in discussion. For example, talking about a device (10) while discussing figure A would refer to an element, 10, shown in figure other than figure A.

Embodiments of the disclosure contemplate that communications network service providers are working diligently to offer advanced communication services such as interactive video, telephony services, and high-speed data for Internet and World Wide Web communications. To deliver such services, embodiments of the disclosure contemplate that the corresponding networks must become faster, higher bandwidth, and more reliable.

One way to achieve higher bandwidths for improved communications is through the use of fiber optic cables. Fiber optic cables are capable of carrying orders of magnitude more data than are coax cables. At the same time, fiber optic cable installations are expensive. It would be cost prohibitive, using current pricing models, to fully convert the legacy coax cable networks serving thousands of subscribers to optical networks.

With this cost consideration in mind, many network service providers employ what are known as hybrid fiber coax or "HFC" systems. HFC systems allow service providers to connect end users served by coax cables with head-end or hub devices that deliver data through fiber optic cables in a cost effective manner. In an HFC system, centrally disposed components such as network head ends, hub devices, servers, and so forth deliver and receive data to and from the network using fiber optic cables. Termination points, i.e., customers and their corresponding client devices, are served by coax cables.

The bridge between the centrally disposed components and the client or network termination devices are optical node modules are incorporated into the network. A "node" is a device that receives optical signals via a fiber optic network, converts those signals to RF signals, and delivers RF signals via a coax cable network. Accordingly, optical node modules receive optical data via fibers, convert that data to RF signals, and deliver those RF signals to legacy coax networks.

Frequently, amplification is required to successfully deliver those RF signals to the network termination devices with a requisite quality of service. Accordingly, network service providers must place RF amplifiers between nodes and the network termination devices. The amplifier receives RF signals, applies signal processing such as pre-amplification, amplification, or other processing, and delivers the processed RF signals to a coax network.

These nodes are frequently located in odd locations. For example, they can sometimes be hung from a ground strand in an equipment installation or equipment bunker. Such thick strand wires may also be found in yard pedestals, street cabinets, sewers, pits, basements, public areas, connected to telephone poles, and so forth. In other situations, they can be placed in a hole in the ground. In other situations, they can simply be placed near a sidewalk with a thin plastic housing covering the node.

To ensure reliability of the various amplifiers, power supplies, and other electrical components associated with a node, these electrical components are generally placed in a housing. Since the housing is sometimes exposed to the elements, it generally needs to be weatherproof. Frequently, these housings are configured as a "trunk" and are made out of aluminum. These trunks have a defined volume and surface area, which defines a physical limit on how much thermal heat they can dissipate. For example, a commonly installed, aluminum, RF amplifier node trunk can dissipate about 154 watts.

As the demand for data has grown, network services providers have experienced higher and higher data throughput per customer. Embodiments of the disclosure contemplate that this increase in per-user data throughput may be growing at a rapid cumulative annual growth rate. This increased demand and year-over-year growth strains existing networks with respect to the bandwidth or available network capacity per household passed ("MP"). This is especially true with each HHP is served by a legacy coax network with limited bandwidth capabilities.

As network capacity becomes strained, many network communications service providers would like to add additional amplifiers to their nodes. They may also want to add or replace digital signal processing components, signal conditioning components, signal splitters, signal receivers, signal transmitters, or other components used in network communications systems. However, with each component added, additional power supplies and other corresponding electrical equipment may need to be added as well. Each of these electrical components generates heat. Completely changing nodes is expensive. However, due to the physical limitations defined by the volume and material of the trunk, there has traditionally been no way to increase the heat transfer capacity of a deployed node when additional electronic component payloads are proposed. This results in compromised features, schedules, and costs. Moreover, this limits the ability of the network service provider to increase its data throughput and data processing bandwidth.

When new electronic component payloads are forced to accommodate the limited thermal dissipation capability of an existing deployed trunk housing, compromises must be made. These include scaling back or jettisoning new features. It can also result in the delay of feature deployment until new, lower power consumptive electrical components are developed.

If new features are added, thereby increasing the thermal energy generated within the trunk, problems can arise. These include lower reliability and higher operating costs. High temperatures can reduce the reliability of the electrical components. Additionally, these high temperatures may increase costs due to additional service failures and replacement needs.

Embodiments of the present disclosure provide a solution to this dilemma. In one or more embodiments segmented, configurable heat transfer devices are coupled between a trunk and a thermal energy sink, such as the earth, a concrete slab, a metal beam or slab, or other object capable of sinking thermal energy. The coupling of the heat transfer devices between the housing defining the trunk and the thermal energy sink increases the thermal energy dissipation capability of an existing trunk to accommodate the new requirements of the added electrical component payload. A trunk previously able to dissipate only 154 watts, for example, may be able to dissipate 175 watts or more when the heat transfer devices are coupled between the trunk and the thermal energy sink.

The heat transfer devices can be coupled between the housing and the thermal energy sink in a variety of ways. In one embodiment, the housing is configured—or is retrofitted—with purposely-integrated mechanical interface components configured to couple to the heat transfer devices using specific designed-in features. In another embodiment, the heat transfer devices can be coupled to a thermal coupler having a plurality of thermal convection fins extending therefrom. These thermal convection fins can then engage or abut other thermal convection fins extending from the housing to increase the thermal energy dissipation capability of the housing. In still another embodiment, the heat transfer devices can pass through unused ports of the housing to couple to internal, modular heat sink components. In still another embodiment the heat transfer devices can be coupled to the housing by bolts or screws. Still other techniques for coupling the heat transfer devices to the housing and/or thermal energy sink will be obvious to those of ordinary skill in the art having the benefit of this disclosure.

Advantageously, in one or more embodiments systems configured in accordance with the disclosure provide key enabling technologies that increase the capability of an electronics enclosure to dissipate heat. This allows the electronics enclosure to support features requiring electrical components that generate additional heat to facilitate new features or expansion requirements. Embodiments of the disclosure thus constitute an important improvement associated with heat dissipation in housings that need to accommodate increasing electrical component payloads. Embodiments of the disclosure advantageously provide a solution allowing enclosures of electrical components to scale their heat dissipation capacity beyond their initial limit. Embodiments of the disclosure provide a system of electronic enclosures with heat transfer devices that are mechanically segmentable and can be configured to dissipate most required heat loading of the enclosure itself.

Embodiments of the disclosure differ from prior art attempts to solve this problem. For example, U.S. Pat. No. 7,701,714 to Shabany teaches a liquid-air hybrid cooling system for electronics equipment. However, the '714 patent fails to provide the segmentability and positionability of the heat transfer devices described in the present disclosure. Accordingly, the '714 patent is unable to scale to support additional electronic component payloads.

Similarly, US Published Patent Application No. 2011/0277967 to Fried et al. teaches a liquid cooled condenser for an electronic disclosure. However, like the '714 patent, the '967 application fails to provide the segmentability and positionability of the heat transfer devices described in the present disclosure. Accordingly, the '714 patent is unable to scale to support additional electronic component payloads.

In one or more embodiments, a system comprises a housing. In one or more embodiments, the housing is configured as a "trunk" and includes a base and a lid. The lid is pivotably coupled to the base by one or more hinges. One or more heat-generating electrical components are situated within the housing. These heat-generating electrical components can include power supplies, RF amplifiers, power distribution boards, fiber optic receiver modules, digital transmitters, or other associated components. In one or more embodiments, both the lid and the base includes one or more apertures configured as physical "ports" through which electrical connections to the various heat-generating electrical components can be made from exterior of the housing.

In one or more embodiments, the housing is deployed at a location and is physically coupled to infrastructure there. For example, in one embodiment hanging brackets are attached to the housing so that the housing can be hung from a cable strand or rod. In another embodiment, offset brackets are coupled to the housing so that it can be coupled to a horizontal surface, such as a concrete slab. In still other embodiments, the housing is simply placed upon the ground. Of course, combinations of these deployment and physical configurations could be used as well.

In one or more embodiments, one or more heat transfer devices then couple the housing to a thermal energy sink. As noted above, examples of thermal energy sinks can include as the earth, a concrete slab, a metal beam or slab, or other object capable of sinking thermal energy without significantly increasing its temperature. Other thermal energy sinks will be obvious to those of ordinary skill in the art having the benefit of this disclosure. By coupling the one or more heat transfer devices between the housing and the thermal energy sink, thermal energy generated by the one or more heat-generating components disposed within the housing can be transferred from the housing to the thermal energy sink. This allows the housing to dissipate more heat than it could by convection alone, thereby increasing the electrical component payload that can be positioned within the housing.

The heat transfer devices are segmented because the number of heat transfer devices coupling the housing to the thermal energy sink can vary based upon application. Similarly, the location of the heat transfer devices coupling the housing to the thermal energy sink can vary based upon application as well. For example, in a high payload housing more heat transfer devices can couple the housing to the thermal energy sink than in a low payload housing. Similarly, if the left side of a housing encompasses hotter components than the right, the heat transfer devices can couple the housing to the thermal energy sink more densely on the left side than the right, and so forth. Other advantages of embodiments of the disclosure will be described below. Still others will be obvious those of ordinary skill in the art having the benefit of this disclosure.

Figure 1:
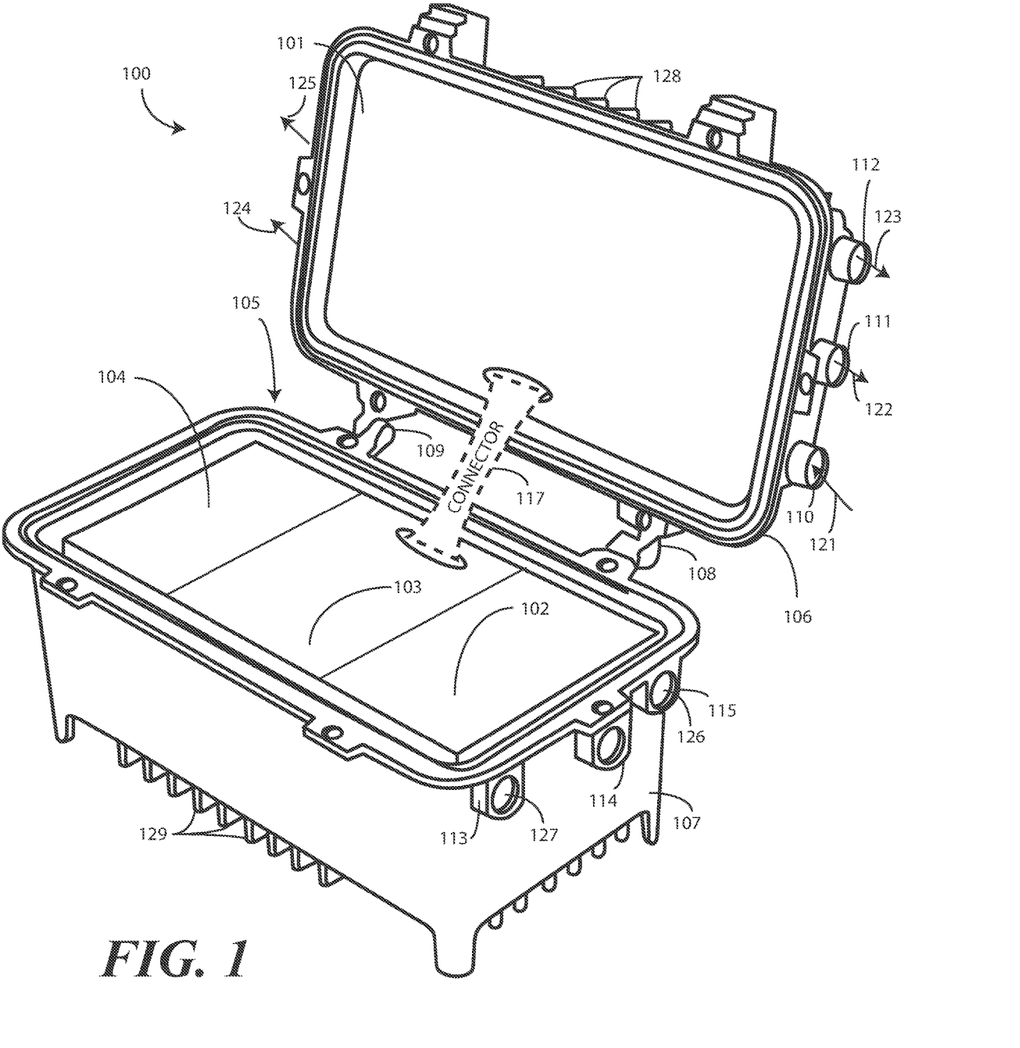
FIG. 1 illustrates one explanatory housing in accordance with one or more embodiments of the disclosure.

Turning now to FIG. 1, illustrated therein is one explanatory module 100 for a HFC network in accordance with one or more embodiments of the disclosure. In one embodiment, the module 100 includes several electrical components, many of which generate heat. In one or more embodiments, these electrical components include a quad-output amplifier module 101, a power supply 102 operable with the quad-output amplifier module 101, a control board 103, and a node/amplifier determination module 104.

In one or more embodiments, these heat-generating electrical components are placed within a housing 105 that includes a lid 107 and a base 106. In this illustrative embodiment, the housing 105 resembles a vintage luggage trunk, and is thus sometimes known as a "trunk." In this illustrative embodiment, each of the quad-output amplifier module 101, the power supply 102, the control board 103, and the node/amplifier determination module 104 are placed in either the lid 107 or the base 106 of the housing 105, just as one would pack a vintage luggage trunk with clothes or other objects.

In one or more embodiments, the trunk is thermally conductive. Illustrating by example, in one embodiment the trunk is manufactured from aluminum. Aluminum conducts heat. Accordingly, when the heat-generating electrical components positioned within the trunk generate heat, the thermally conductive aluminum of the housing 105 conducts this heat through the aluminum so that it can be dissipated by radiation and/or convection to the environment.

In one or more embodiments, one or more of the base 106 or the lid 107 defines a plurality of convection fins 128,129. In this illustrative embodiment, both the base 106 and the lid 107 define a plurality of convection fins 128,129. These convection fins 128,129 increase the surface area of the housing 105, thereby also dissipating thermal energy generated by the one or more heat-generating electrical components through the one or more of the base or the lid by radiation and/or convection.

In this illustrative embodiment, a first portion of the housing 105 defines the base 106 of the housing 105, while a second portion defines the lid 107 of the housing 105. Note that as shown in FIG. 1, the base 106 is disposed above the lid 107. It should be noted that this is the convention that will be used herein, namely, the bottom, deeper portion is the lid 107 and the upper, shallower portion is the base 106.

In one or more embodiments, the base 106 and lid 107 are pivotably coupled together by one or more hinges 108,109. This allows the housing 105 can be closed to define a weatherproof, thermally conductive housing for convenient, and weatherproof, deployment in the field. While hinges 108,109 are shown as an illustrative embodiment, in other embodiments the base 106 and lid 107 may simply be bolted together without any hinged connection. Other techniques for coupling the base 106 and lid 107 will be obvious to those of ordinary skill in the art having the benefit of this disclosure.

In one embodiment, the base 106 of the housing 105 includes one or more apertures 110,111,112 through which input and/or output cables can pass to couple to the heat-generating electrical components disposed within the housing 105. Similarly, the lid 107 of the housing 105 can include one or more apertures 113,114,115 through which cables can be coupled to the internal components of the housing 105. In one embodiment, these apertures 110,111,112 are mechanical "ports" through which fiber optic cables, coaxial cables, and other cables can pass to make electrical connections with the heat-generating electrical components from exterior of the housing 105. Where these ports are not used, they can be sealed to make the housing 105 weatherproof.

In this illustrative embodiment, the quad-output amplifier module 101 is disposed in the base 106 of the housing 105. The power supply 102, control board 103, and node/amplifier determination module 104 are disposed in the lid 107 of the housing 105. Those of ordinary skill in the art having the benefit of this disclosure will understand that other configurations may be more suitable for other applications. For example, the quad-output amplifier module 101 is disposed in the lid 107 of the housing 105, while the power supply 102, control board 103, and node/amplifier determination module 104 are disposed in the base 106 of the housing 105 and so forth.

In one embodiment, one or more electrical connectors 117 couple electrical components situated within the base 106 to the electrical components situated in the lid 107. In this illustrative embodiment, the one or more electrical connectors 117 couple the quad-output amplifier module 101 to the control board 103, which is electronically coupled to the node/amplifier determination module 104. Other connectors may provide power to the node/amplifier determination module 104. The control board 103 may include one or more connectors to which a corresponding connector may be attached. In one embodiment, each connector may be coupled to an external power source. Power source connectors may be disposed along the housing 105 so that cables from external power sources may be attached in one or more embodiments.

It should be noted that the module 100 of FIG. 1 is being used for illustrative purposes only, as an HFC network module is well suited to benefit from embodiments of the disclosure. However, those of ordinary skill in the art having the benefit of this disclosure will appreciate that embodiments of the disclosure can be applied to other devices having heat-generating components situated within a thermally conductive housing as well. Accordingly, the embodiment of FIG. 1 is not intended to limit the scope of the claims below.

Figure 2:
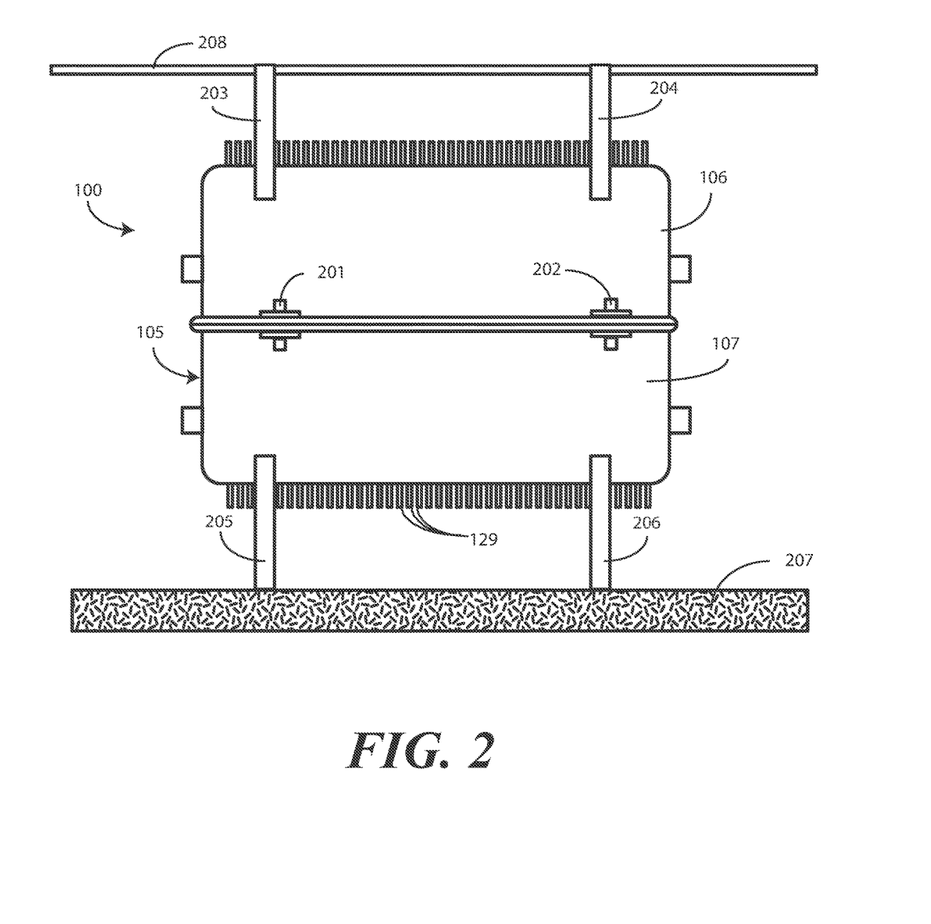
FIG. 2 illustrates one explanatory housing in accordance with embodiments of the disclosure deployed in the field.

Turning now to FIG. 2, illustrated therein is the module 100 in one explanatory configuration when deployed in the field. As shown the base 106 and lid 107 of the housing 105 have been coupled together by one or more fasteners 201, 202. This transforms the housing 105 into a weatherproof housing.

In this illustrative embodiment, the housing 105 is deployed at a location and is physically coupled to infrastructure there. As shown in FIG. 2, one or more hanging brackets 203,204 are attached to the housing 105. The one or more hanging brackets 203,204 then couple to a cable strand 208 or other structure, such as a horizontally mounted rod or pole. One or more offset brackets 205,206 are also coupled to the housing. In this illustrative embodiment, the offset brackets 205,206 elevate the housing 105 above a thermal energy sink 207, which in this embodiment is a concrete slab. The thermal energy sink 207 serves as a thermal energy dissipation reservoir or thermal ground in this embodiment. The offset brackets 205,206 provide separation from the thermal energy sink 207 so that the plurality of convection fins 129 coupled to the lid 107 can dissipate thermal energy by convection and/or radiation.

It should be noted that the one or more hanging brackets 203,204 and the one or more offset brackets 205,206 need not necessarily be used in combination. In some embodiments, only the one or more hanging brackets 203,204 will be used. In other embodiments, only the one or more offset brackets 205,206 will be used. While two hanging brackets 203,204 are shown, other installations may use more than, or fewer than, the two hanging brackets 203,204. Similarly, while there are two offset brackets 205,206 shown, other installations will use more, or fewer, offset brackets.

Moreover, other configurations and techniques for deploying the module 100 in the field will be obvious to those of ordinary skill in the art having the benefit of this disclosure. Illustrating by example, in still other embodiments the housing 105 can simply placed upon the ground. Of course, combinations of these deployment and physical configurations could be used as well.

Figure 3:
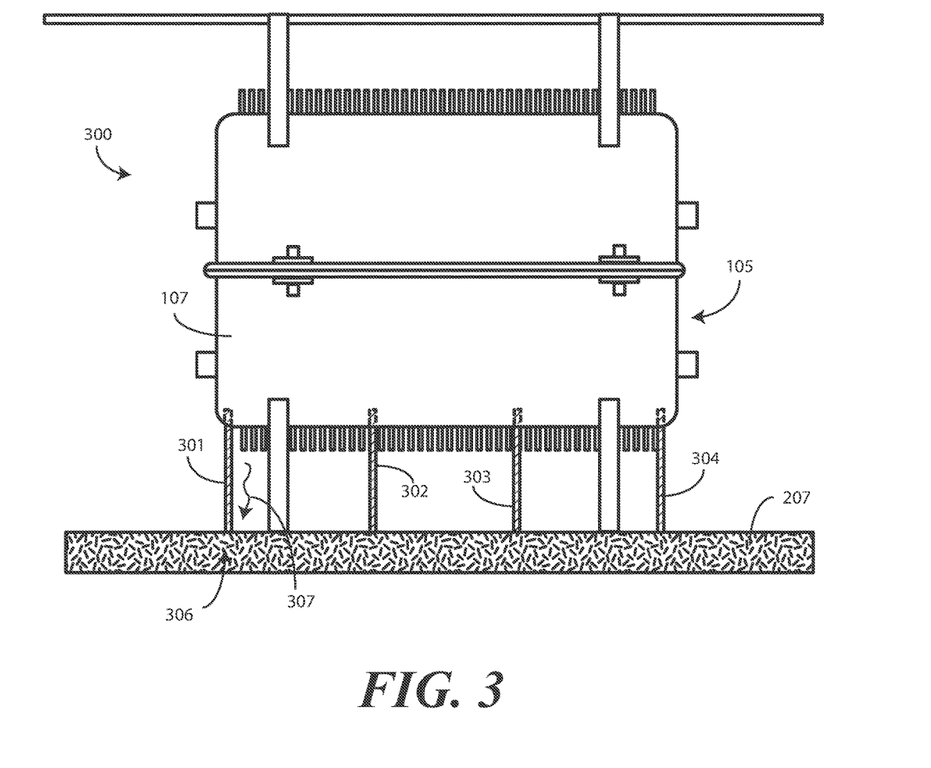
FIG. 3 illustrates one explanatory system in accordance with one or more embodiments of the disclosure.

Turning now to FIG. 3, illustrated therein is one explanatory system 300 configured in accordance with one or more embodiments of the disclosure. As shown in FIG. 3, one or more heat transfer devices 301,302,303,304 are coupling the housing 105 to the thermal energy sink 207. By coupling the one or more heat transfer devices 301,302,303,304 between the housing 105 and the thermal energy sink 207, thermal energy generated by the one or more heat-generating components disposed within the housing 105 can advantageously be transferred from the housing 105 to the thermal energy sink 207. This allows the housing 105 to dissipate more heat than it could by convection alone, thereby increasing the electrical component payload that can be positioned within the housing 105.

In this illustrative embodiment, there are four heat transfer devices 301,302,303,304 coupling the housing 105 to the thermal energy sink 207. Additionally, the four heat transfer devices 301,302,303,304 are evenly spaced across the base 106. However, as noted above, the heat transfer devices 301,302,303,304 are segmented in that they are separable from each other and can be added between the housing 105 and the thermal energy sink 207 one at a time based upon application. Said differently, the heat transfer devices 301, 302,303,304 are segmented because the number of heat transfer devices 301,302,303,304 coupling the housing 105 to the thermal energy sink 207 can vary based upon application. Similarly, the location of the heat transfer devices 301,302,303,304 coupling the housing 105 to the thermal energy sink 207 can vary based upon application as well, as noted above.

The heat transfer devices 301,302,303,304 can take various forms. In one embodiment, the heat transfer devices 301,302,303,304 are bars of thermally conductive material, such as aluminum. In another embodiment, the heat transfer devices 301,302,303,304 each comprise a two-phase heat exchanger that translates thermal energy from the hotter component, here the housing 105, to the cooler component, which is the thermal energy sink 207 in this embodiment. In still another embodiment, the heat transfer devices 301,302, 303,304 each comprise a heat pipe.

Figure 4:
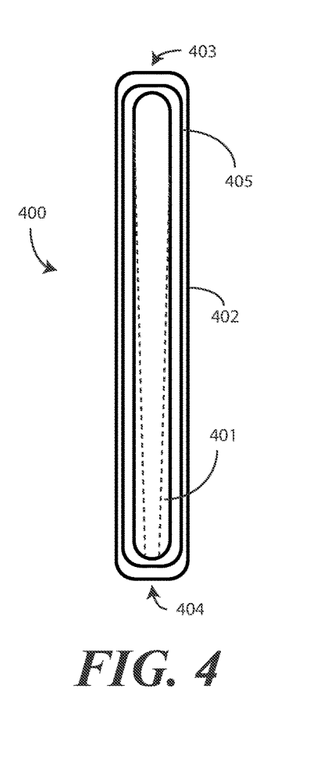
FIG. 4 illustrates one explanatory heat transfer device in accordance with one or more embodiments of the disclosure.

Turning now to FIG. 4, illustrated therein is one example of a heat transfer device 400 configured in accordance with one or more embodiments of the disclosure. This illustrative heat transfer device 400 is a heat pipe. The heat pipe comprises a phase transition media 401 disposed within a housing 402. Examples of phase transition media 401 include water, where the housing 402 is manufactured from copper, or ammonia, where the housing 402 is manufactured from aluminum. Other examples of phase transition media 401 include liquid helium, mercury, sodium, indium, alcohol, or ethanol. Other types of phase transition media 401 will be obvious to those of ordinary skill in the art having the benefit of this disclosure.

In its most basic form, the phase transition media 401 evaporates and becomes a vapor at a hotter end 403 of the heat transfer device 400. This hotter end 403 of the heat transfer device 400 is known as the evaporator. The phase transition media 401 then moves, via adiabatic action, to a cooler end 404 of the heat transfer device 400, where it condenses into a liquid by releasing the heat it absorbed when evaporating to the exterior of the cooler end 404. This cooler end 404 of the heat transfer device 400 is known as the condenser.

In other embodiments, a wick 405 can be added to transfer the phase transition media 401 from the cooler end 404 to the hotter end 403 by capillary action. Examples of wicks 405 include metal powders, wood, or fabrics. Other types of wicks 405 will be obvious to those of ordinary skill in the art having the benefit of this disclosure.

Turning now back to FIG. 3, when the heat transfer devices 301,302,303,304 are coupled to the housing 105, the phase transition media (401) transitions from a vapor at a first end 305, which is coupled to the housing 105, to a liquid at a second end 306, coupled to the thermal energy sink 207. This transfers thermal energy 307 generated by the one or more heat-generating electrical components from the housing 105 to the thermal energy sink 207.

The heat transfer devices 301,302,303,304 can be coupled to the housing 105 and/or thermal energy sink 207 in a variety of ways. In a simple embodiment, the heat transfer devices 301,302,303,304 can simply be taped or glued to the housing 105 and/or thermal energy sink 207. In another embodiment, the heat transfer devices 301,302,303,304 can be thermally bonded, for example with a thermally conductive adhesive, to the housing 105 and/or thermal energy sink 207. In still another embodiment, the heat transfer devices 301,302,303,304 can pass through unused ports of the housing 105 to couple to internal, modular heat sink components. In still another embodiment the heat transfer devices 301,302,303,304 can be coupled to the housing 105 by bolts or screws. Still other techniques for coupling the heat transfer devices 301,302,303,304 to the housing 105 and/or thermal energy sink 207 will be obvious to those of ordinary skill in the art having the benefit of this disclosure.

Figure 5:
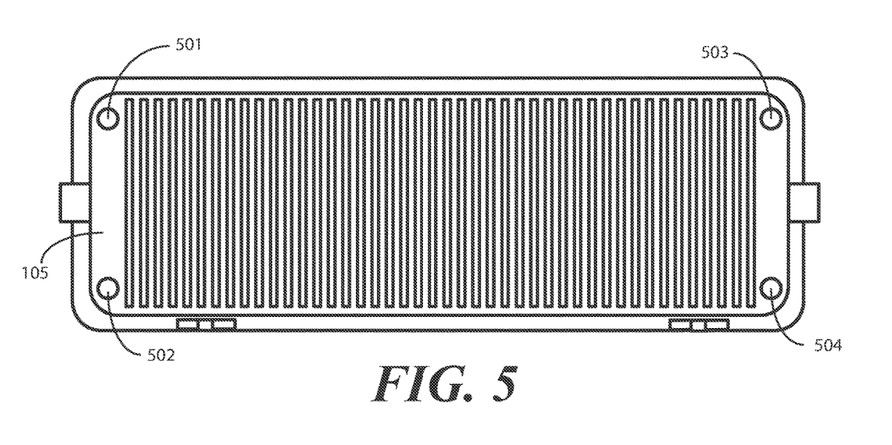
FIG. 5 illustrates one side of an explanatory housing in accordance with one or more embodiments of the disclosure.

Turning now to FIG. 5, in one or more embodiments the base and/or lid of the housing 105 can be configured with one or more mechanical connectors 501,502,503,504 for coupling the heat transfer devices (301,302,303,304) to the housing 105. In this illustrative embodiment, the mechanical connectors 501,502,503,504 each comprise an aperture, defined by the base or lid of the housing, that can receive the heat transfer devices (301,302,303,304) by insertion. These mechanical connectors 501,502,503,504 can be formed into the housing 105 when the housing 105 is constructed in one or more embodiments. In alternate embodiments, the mechanical connectors 501,502,503,504 can be created in the field, such as by drilling into the housing 105. The thermal energy sink (207) can be similarly configured with mechanical connectors as well.

In the illustrative embodiment of FIG. 5, the heat transfer devices (301,302,303,304) can simply be inserted into the mechanical connectors 501,502,503,504. The heat transfer devices (301,302,303,304) are then retained within the mechanical connectors 501,502,503,504 by friction. However, in other embodiments the mechanical connectors 501,502,503,504 can be configured in other ways.

Figure 6:
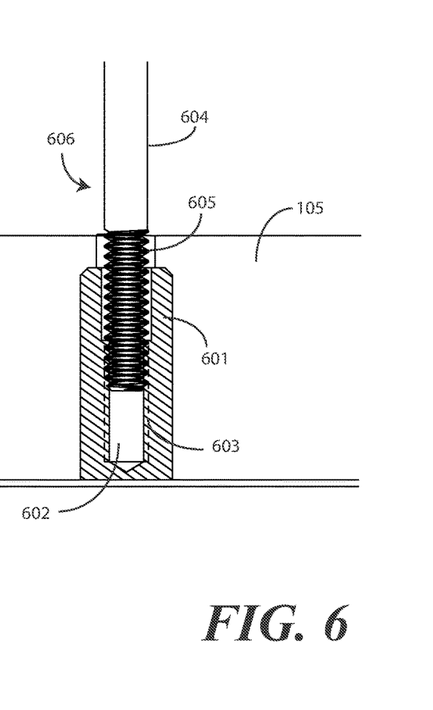
FIG. 6 illustrates one explanatory mechanical receiver for a heat transfer device in accordance with one or more embodiments of the disclosure.

Illustrating by example, and turning now to FIG. 6, illustrated therein is another mechanical connector 601 that can be created in one or both of the housing 105 or the thermal energy sink (207). In this illustrative embodiment, the mechanical connector 601 comprises an aperture 602 defining a threaded interior sidewall 603. The housing 604 of the heat pipe 606 has been configured with a threaded sidewall 605 as well. Accordingly, the heat pipe 606 can be threaded into the aperture 602 for a more secure fit. It should be noted that friction-retaining mechanical connectors and threaded mechanical connectors are just two types of mechanical connectors that can be used in accordance with embodiments of the disclosure. Numerous others will be obvious to those of ordinary skill in the art having the benefit of this disclosure.

Figure 7:
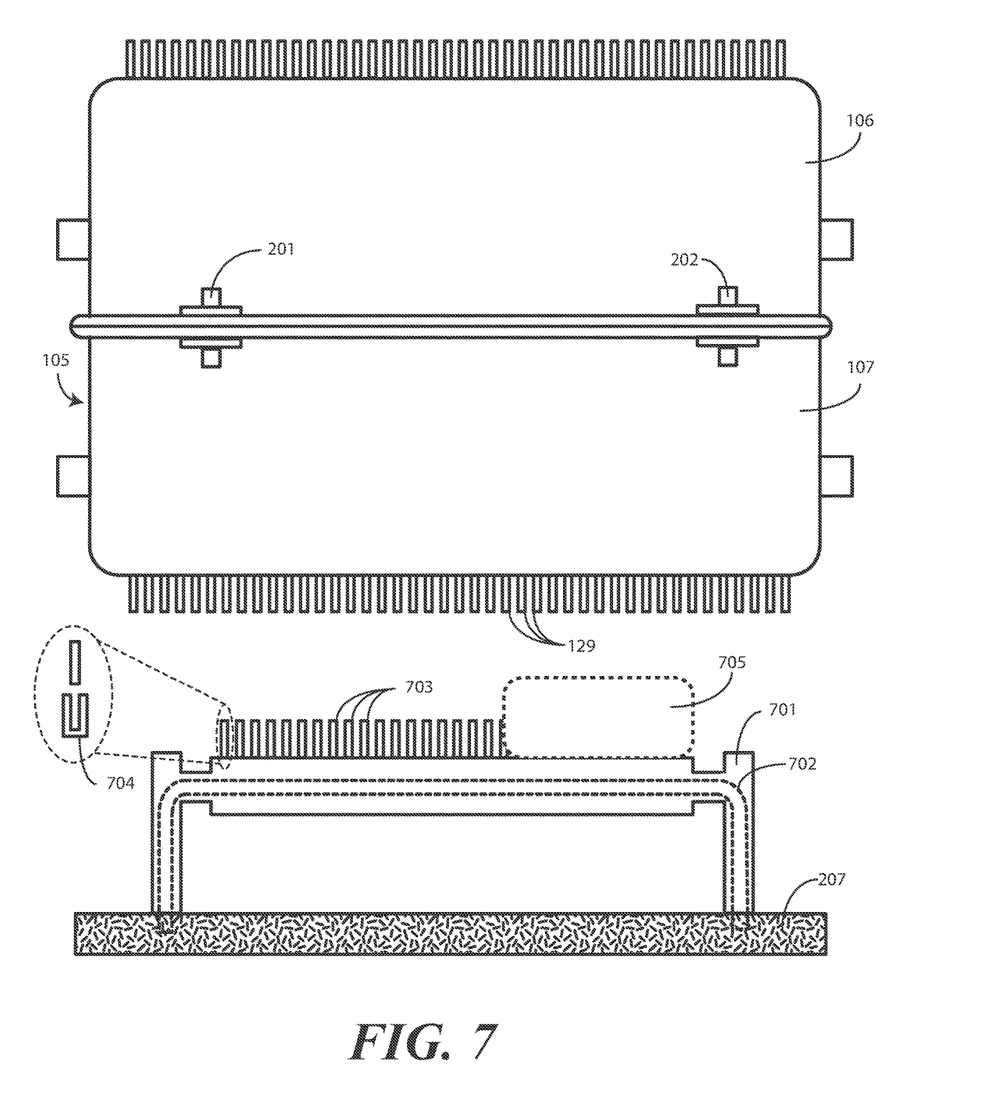
FIG. 7 illustrates an alternate system in accordance with one or more embodiments of the disclosure.

Turning now to FIG. 7, illustrated therein is another system 700 configured in accordance with one or more embodiments of the disclosure. As was the case above with reference to FIG. 3, the base 106 and lid 107 of the housing 105 have been coupled together by one or more fasteners 201,202 to make the housing 105 weatherproof.

In this embodiment a thermal coupler 701 is shown. The thermal coupler 701 is configured as a heat sink in this embodiment, and is manufactured from a thermally conductive material such as aluminum. The thermal coupler 701 is then attached to one or more heat transfer devices. In this illustration, a heat pipe 702 passes through the thermal coupler 701 and is thermally coupled to the thermal coupler 701. The heat pipe 702 is then coupled to a thermal energy sink 207.

As shown in FIG. 7, in one or more embodiments the thermal coupler 701 comprises a plurality of convection fins 703. In this illustrative embodiment, each convection fin of the plurality of convection fins 703 is each complementary in shape to each of the plurality of convection fins 129 extending distally from the lid 107 of the housing 105. However, in other embodiments the plurality of convection fins 703 could take other shapes as well. For example, in another embodiment each convection fin of the plurality of convection fins 703 could be U-shaped 704. Other shapes for the plurality of convection fins 703 extending distally from the thermal coupler 701 will be obvious to those of ordinary skill in the art having the benefit of this disclosure.

In other embodiments, the thermal coupler 701 may not include the convection fins 703. Instead, a thermal gap pad 705 may be placed between the thermal coupler 701 and the plurality of convection fins 703 extending distally from the lid 107 of the housing 105. Thermal gap pads 705 are manufactured, for example with polymer fillers that may optionally be reinforced with a material such as fiberglass. These thermal gap pads 705 have a high thermal conductivity and, where employed as shown in FIGS. 7-8, work to transfer thermal energy from the housing 105 to the thermal coupler 701.

In one or more embodiments, the plurality of convection fins 703 are configured to engage the plurality of convection fins 129 extending distally from the lid 107 of the housing 105 when the housing 105 is placed next to the thermal coupler 701. In other embodiments, the thermal gap pad 705 is compressed between the housing 105 and the thermal coupler 701. These embodiments are shown in FIG. 8.

Figure 8:
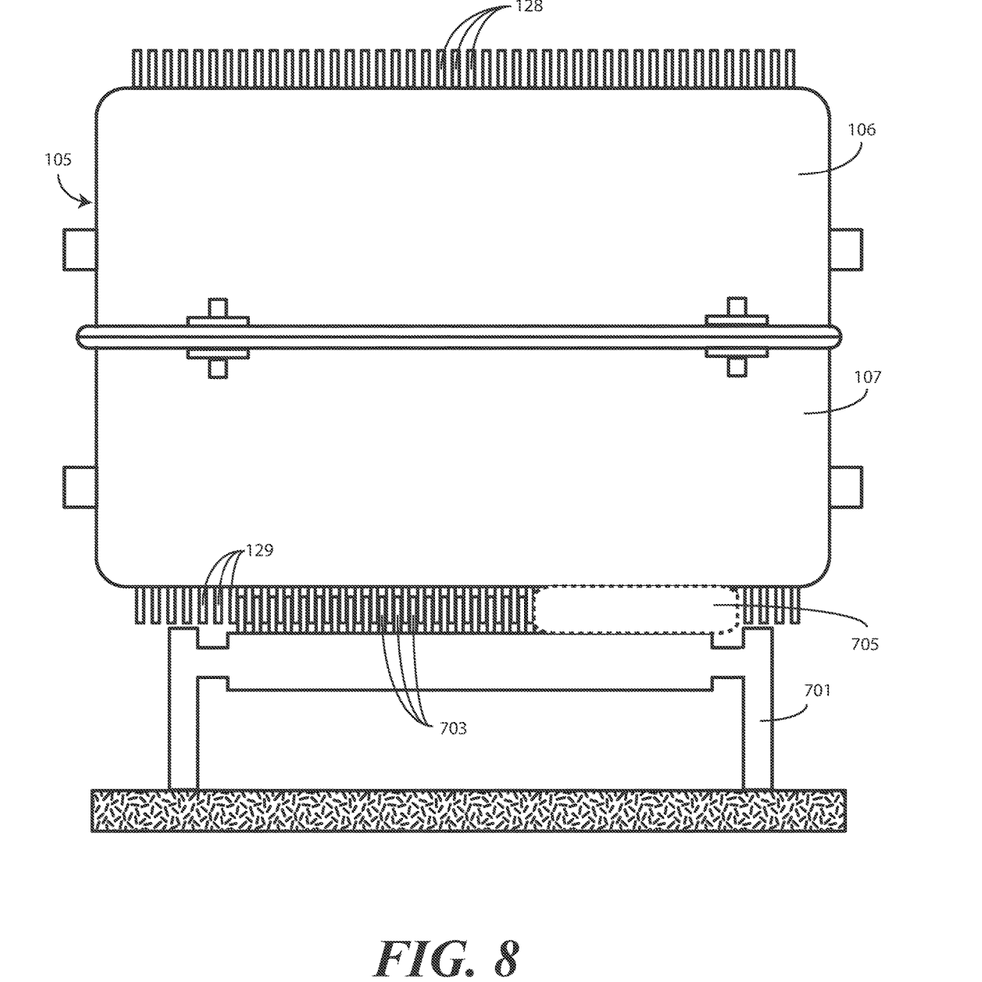
FIG. 8 illustrates another view of an alternate system in accordance with one or more embodiments of the disclosure.

Turning now to FIG. 8, as shown on the left side of the figure, the housing 105 is placed next to the thermal coupler 701. Accordingly, the plurality of convection fins 703 extending distally from the thermal coupler 701 abut the plurality of convection fins 129 extending distally from the lid 107 of the housing 105. This causes the plurality of convection fins 703 extending distally from the thermal coupler 701 to transfer thermal energy generated by the one or more heat-generating electrical components from the housing 105, through the heat pipe (702), to the thermal energy sink 207. Had the plurality of convection fins 703 extending from the thermal coupler 701 been U-shaped (704), the interior of each U-shape could define a receiver to receive each convection fin of the plurality of convection fins 129 extending distally from the lid 107 of the housing 105. It should be noted that while the plurality of convection fins 703 extending distally from the thermal coupler 701 is shown engaging the plurality of convection fins 129 extending distally from the lid 107 of the housing 105 in FIG. 8, another coupler could engage the plurality of convection fins 128 extending distally from the base 106 of the housing 105 as well.

As shown on the right side of the figure, the thermal gap pad 705 can alternatively be placed between the housing 105 and the thermal coupler 701. Accordingly, the thermal gap pad 705 engages the plurality of convection fins 129 extending distally from the lid 107 of the housing 105. This causes the thermal gap pad 705 to transfer thermal energy generated by the one or more heat-generating electrical components from the housing 105, through the heat pipe (702), to the thermal energy sink 207.

Figure 9:
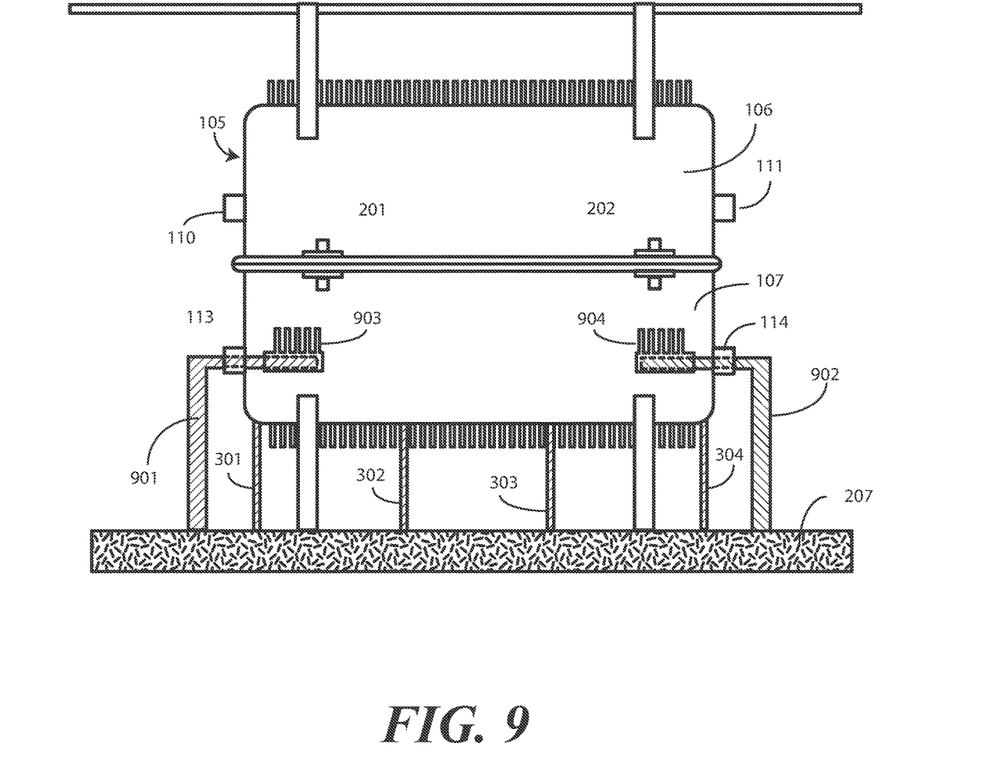
FIG. 9 illustrates still another explanatory system in accordance with one or more embodiments of the disclosure.

Turning now to FIG. 9, illustrated therein is another system 900 configured in accordance with one or more embodiments of the disclosure. As was the case above with reference to FIGS. 3 and 7, the base 106 and lid 107 of the housing 105 have been coupled together by one or more fasteners 201,202 to make the housing 105 weatherproof. Also, as before, the base 106 of the housing 105 includes one or more apertures 110,111 through which input and/or output cables can pass to couple to the heat-generating electrical components disposed within the housing 105. Similarly, the lid 107 of the housing 105 can include one or more apertures 113,114 through which cables can be coupled to the internal components of the housing 105. In one embodiment, these apertures are mechanical "ports" through which fiber optic cables, coaxial cables, and other cables can pass to make electrical connections with the heat-generating electrical components from exterior of the housing 105.

Embodiments of the disclosure contemplate that there are situations in which some of these ports will not be used. Where this is the case, heat pipes 901,902 can pass through the apertures 113,114 to remove heat from the interior of the housing 105.

In this illustrative embodiment, one or more heat pipes 901,902 each pass through at least one aperture 113,114 of the housing 105 from an exterior of the housing 105 to an interior of the housing 105. In this illustrative embodiment, one or more heat sinks 903,904 are situated in the interior of the housing 105.

A first end of each heat pipe 901,902 couples to the thermal energy sink 207. However, a second end of each heat pipe 901,902 is coupled to a heat sink 903,904. Accordingly, heat received by the heat sinks 903,904 will be transferred to the corresponding heat pipe 901,902 and transferred out of the housing 105 to the thermal energy sink 207.

It should be noted that the embodiment of FIG. 3, the embodiment of FIG. 8, and the embodiment of FIG. 9 can be used in any combination. Illustrating by example, as shown in FIG. 9, one or more heat transfer devices 301, 302,303,304 from FIG. 3 are also coupling the housing 105 to the thermal energy sink 207. By coupling the one or more heat transfer devices 301,302,303,304 between the housing 105 and the thermal energy sink 207, even more thermal energy generated by the one or more heat-generating components disposed within the housing 105 can advantageously be transferred from the housing 105 to the thermal energy sink 207. This allows the housing 105 to dissipate more heat than it could using the embodiment of FIG. 9 alone, thereby increasing the electrical component payload that can be positioned within the housing 105. The embodiment of FIG. 8 could be added to FIG. 9 as well.

Figure 10:
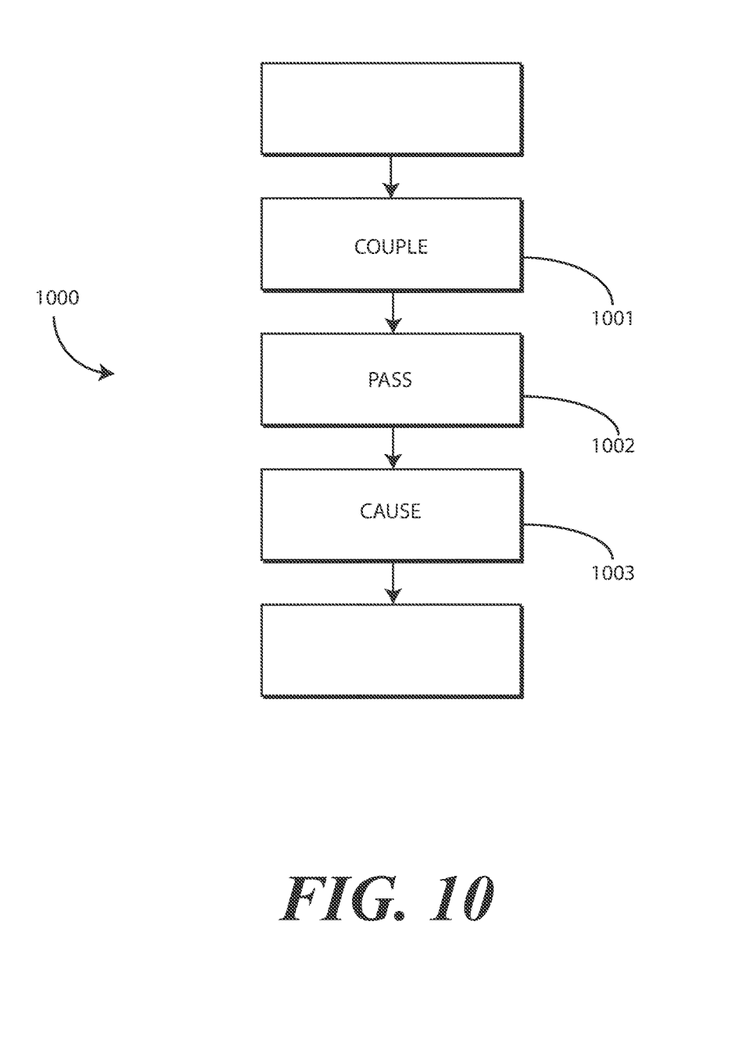
FIG. 10 illustrates one explanatory method in accordance with one or more embodiments of the disclosure.

Turning now to FIG. 10, illustrated therein is one explanatory method 1000 in accordance with one or more embodiments of the disclosure. At step 1001, the method 1000 includes coupling one or more heat pipes between a housing and a thermal energy sink. In one or more embodiments the housing includes one or more heat-generating electrical components therein and defines a plurality of convection fins dissipating thermal energy generated by the one or more heat-generating electrical components through the housing. The coupling at step 1001 causes thermal energy generated by the one or more heat-generating electrical components to be transferred from the housing to the thermal energy sink.

In one or more embodiments, the housing defines one or more apertures. Where this is the case, optional step 1002 includes passing at least one heat pipe from an exterior of the housing to an interior of the housing.

In one or more embodiments, a thermal coupler or heat sink is coupled to the one or more heat pipes. The thermal coupler or heat sink can define another plurality of convection fins to at least one heat pipe. In one or more embodiments, the housing can also define one or more convection fins. Where this is the case, optional step 1003 can include causing the other plurality of convection fins of the thermal coupler or heat sink to engage the plurality of convection fins extending from the housing. In one embodiment, step 1003 causes the other plurality of convection fins of the thermal coupler or heat sink to abut the plurality of convection fins extending from the housing. In another embodiment, step 1003 causes the other plurality of convection fins of the thermal coupler or heat sink to receive the plurality of convection fins extending from the housing. This can be the case where the other plurality of convection fins of the thermal coupler or heat sink are each configured in a U-shape, for example.

As shown and described, embodiments of the disclosure provide a configurable, segmented heat exchanger system implemented, in one embodiment, using heat pipes that interface with electronics housings and enclosures. In one or more embodiments, the design of the heat pipes is such that the heat pipes are mechanically interfaced to the housing metalwork and then also to a thermal reservoir or thermal ground. The heat pipes enable additional thermal transfer relative to the enclosure's original capability.

In one or more embodiments, the interface is mechanically ergonomic such that the heat pipes and heat exchanger can be added after original enclosure installation providing a scaling feature to future upgrades. This enables operators to add thermal dissipation capability at the time they add additional electronic payloads. The number, placement, and location of the heat pipes are configurable to the particulars of the original installation. Moreover, the heat pipes are segmented such that they can be added in proportion to the need.

Advantageously, the thermal reservoir heat exchanger system described above can be standard or custom to the installation of the housing or enclosure, and can support geothermal heat exchange (in the case of pedestal or cabinet type arrangements) or radiators for convection in aerial arrangements. The solution is implementable and adaptable to RF amplifier modules and node legacy installations where electronics payloads regularly require upgrade and additional features with additional electrical energy dissipation. The configured thermal dissipation capability enables cooler electronics temperatures, better reliability, lower cost, and better product feature sets.

Embodiments of the disclosure advantageously enable scaling of thermal dissipation capability by mechanically interfacing a configurable and segmented heat exchanger thermal reservoir to an enclosure via heat pipes. The heat pipes, in one or more embodiments, can be mechanically mounted to the enclosure in an ergonomic fashion. Techniques for coupling the heat pipes to the housing include mechanical insertion, threaded and screwed connections, or bolting. Other mechanical coupling techniques will be obvious to those of ordinary skill in the art having the benefit of this disclosure.

In one or more embodiments, the heat pipes are coupled to a thermal energy sink, which can represent a thermal ground, such as soil, cement, gravel, or natural air, and that accepts heat flow from the heat pipes. As the electronics heat the enclosure, heat travels through the heat pipes to the thermal reservoir. Temperatures of the electronics are therefore advantageously minimized. As additional electronic payloads are added to the enclosure and added dissipation is required, additional segments of the heat exchanger and additional heat pipes can be applied. The system works together to enhance reliability, lower operating costs, and improve possible product feature sets that demand more energy dissipation in legacy housings. This solution would apply to RF amplifier node installations that are in cabinets, pedestals, bunkers, buildings, or are aerial.

Embodiments of the disclosure are distinctly different from the prior art. For example, legacy existing enclosures support limited electrical dissipation budgets that severely inhibit operators from installing additional features and product capability. This disclosure presents a system that has scalable dissipation capability consistent with expanding future requirements. The new idea minimizes electronics temperatures and operating costs, which produces better reliability as additional electrical payloads are added to the housing. Embodiments of the disclosure also provide a cost-effective way to add additional thermal dissipation capability to an existing installation.

Figure 11:
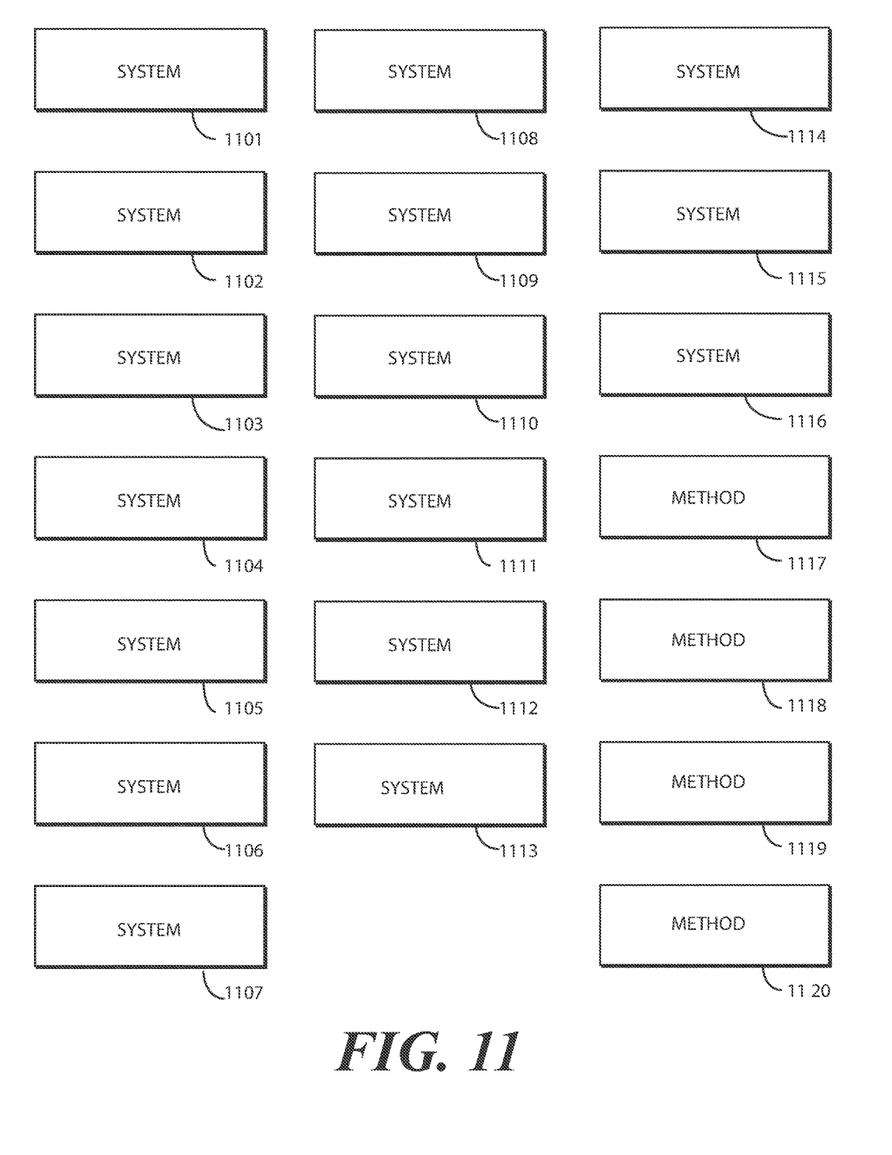
FIG. 11 illustrates one or more embodiments of the disclosure.

Turning now to FIG. 11, illustrated therein are various embodiments of the disclosure. At 1101, a system comprises a housing. At 1101, the housing comprises a base and a lid pivotably coupled to the base by one or more hinges. At 1101, one or more heat-generating electrical components are situated within the housing. At 1101, one or more of the base or the lid comprises one or more apertures through which electrical connections to the one or more heat-generating electrical components can be made from exterior of the housing.

At 1101, the system comprises a thermal energy sink. At 1101, the system comprises one or more heat transfer devices coupling the housing to the thermal energy sink and transferring thermal energy generated by the one or more heat-generating electrical components from the housing to the thermal energy sink.

At 1102, the one or more of the base or the lid of 1101 defines a plurality of convection fins also dissipating the thermal energy generated by the one or more heat-generating electrical components through the one or more of the base or the lid. At 1103, the one or more heat transfer devices of 1102 comprise a phase transition media transitioning from a vapor at a first end coupled to the housing to a liquid at a second end coupled to the thermal energy sink. At 1104, the one or more heat transfer devices of 1103 each comprising a heat pipe.

At 1105, the one or more of the base or the lid of 1103 defines one or more mechanical connectors coupling the one or more heat transfer devices to the housing. At 1106, the at least one mechanical connector of the one or more mechanical connectors of 1105 comprises an aperture defined by the one or more of the base or the lid. At 1107, the aperture of 1106 defines a threaded interior sidewall.

At 1108, the at least one heat transfer device of the one or more heat transfer devices of 1103 passes through at least one aperture of the one or more apertures from an exterior of the housing to an interior of the housing. At 1109, the system of 1108 further comprises at least one heat sink situated in the interior of the housing. At 1109 the first end of the at least one heat transfer device is coupled to the thermal energy sink and the second end of the at least one heat transfer device is coupled to the at least one heat sink.

At 1110, the system of 1102 further comprises a coupler attached to the one or more heat transfer devices, the coupler defining another plurality of convection fins. At 1111, the other plurality of convection fins of 1110 abuts the plurality of convection fins, thereby transferring the thermal energy generated by the one or more heat-generating electrical components from the housing to the thermal energy sink.

At 1112, a system comprises a thermally conductive housing. At 1112, the thermally conductive housing comprises one or more heat-generating electrical components therein. At 1112, the thermally conductive housing defines a plurality of convection fins dissipating thermal energy generated by the one or more heat-generating electrical components through the thermally conductive housing. At 1112, the system also comprises a thermal sink. At 1112, the system comprises one or more heat pipes thermally coupling the thermally conductive housing to the thermal sink.

At 1113, the thermally conductive housing of 1112 defines one or more mechanical receivers into which the one or more heat pipes are inserted. At 1114, the thermally conductive housing of 1112 comprises a base coupled to a lid to define a weatherproof thermally conductive housing, wherein one or more of the base or the lid defines one or more apertures. At 1115, the one or more heat pipes of 1114 pass through at least one aperture of the one or more apertures from the thermal sink, situated at an exterior of the thermally conductive housing, to an interior of the thermally-conductive housing.

At 1116, the system of 1112 further comprises a thermal coupler disposed between at least one heat pipe of the one or more heat pipes and the thermally conductive housing. At 1116, the thermal coupler defines another plurality of convection fins mechanically engaging the plurality of convection fins of the thermally-conductive housing to transfer thermal energy generated by the one or more heat-generating electrical components from the thermally-conductive housing, through the thermal coupler, and to the thermal sink.

At 1117, a method comprises coupling one or more heat pipes between a housing and a thermal energy sink. At 1117, the housing comprises one or more heat-generating electrical components therein. At 1117, the housing defines a plurality of convection fins dissipating thermal energy generated by the one or more heat-generating electrical components through the housing.

At 1118, the housing of 1117 defines one or more apertures. At 1118, the method of 1117 further comprises passing at least one heat pipe from an exterior of the housing to an interior of the housing.

At 1119, the method of 1117 comprises coupling a thermal coupler defining another plurality of convection fins to at least one heat pipe. At 1120, the method of 1119 further comprises causing the other plurality of convection fins to engage the plurality of convection fins.

In the foregoing specification, specific embodiments of the present disclosure have been described. However, one of ordinary skill in the art appreciates that various modifications and changes can be made without departing from the scope of the present disclosure as set forth in the claims below. Thus, while preferred embodiments of the disclosure have been illustrated and described, it is clear that the disclosure is not so limited. Numerous modifications, changes, variations, substitutions, and equivalents will occur to those skilled in the art without departing from the spirit and scope of the present disclosure as defined by the following claims. Accordingly, the specification and figures are to be regarded in an illustrative rather than a restrictive sense, and all such modifications are intended to be included within the scope of present disclosure. The benefits, advantages, solutions to problems, and any element(s) that may cause any benefit, advantage, or solution to occur or become more pronounced are not to be construed as a critical, required, or essential features or elements of any or all the claims.

What is claimed is:

1. A system, comprising:
   a housing, comprising:
      a base;
      a lid pivotably coupled to the base by one or more hinges; and
      one or more heat-generating electrical components situated within the housing;
      wherein one or more of the base or the lid comprising one or more apertures through which electrical connections to the one or more heat-generating electrical components can be made from exterior of the housing;
   a thermal energy sink; and
   one or more heat transfer devices coupling the housing to the thermal energy sink and transferring thermal energy generated by the one or more heat-generating electrical components from the housing to the thermal energy sink;
   the one or more heat transfer devices comprising a phase transition media transitioning from a vapor at a first end coupled to the housing to a liquid at a second end coupled to the thermal energy sink;
   at least one heat transfer device of the one or more heat transfer devices passing through at least one aperture of the one or more apertures from an exterior of the housing to an interior of the housing
   the one or more of the base or the lid defining a plurality of convection fins also dissipating the thermal energy generated by the one or more heat-generating electrical components through the one or more of the base or the lid,
   at least one heat sink situated in the interior of the housing, wherein the first end of the at least one heat transfer device is coupled to the thermal energy sink and the second end of the at least one heat transfer device is coupled to the at least one heat sink.

2. The system of claim 1, the one or more heat transfer devices each comprising a heat pipe.

3. The system of claim 1, the one or more of the base or the lid defining one or more mechanical connectors coupling the one or more heat transfer devices to the housing.

4. The system of claim 3, at least one mechanical connector of the one or more mechanical connectors comprising an aperture defined by the one or more of the base or the lid.

5. The system of claim 4, the aperture defining a threaded interior sidewall.

6. A system, comprising:
   a housing, comprising:
      a base;
      a lid pivotably coupled to the base by one or more hinges; and
      one or more heat-generating electrical components situated within the housing;
      wherein one or more of the base or the lid comprising one or more apertures through which electrical connections to the one or more heat-generating electrical components can be made from exterior of the housing;
   a thermal energy sink; and
   one or more heat transfer devices coupling the housing to the thermal energy sink and transferring thermal energy generated by the one or more heat-generating electrical components from the housing to the thermal energy sink,
   the one or more of the base or the lid defining a plurality of convection fins also dissipating the thermal energy generated by the one or more heat-generating electrical components through the one or more of the base or the lid
   a coupler attached to the one or more heat transfer devices, the coupler defining another plurality of convection fins.

7. The system of claim 6, the one or more heat transfer devices comprising a phase transition media transitioning from a vapor at a first end coupled to the housing to a liquid at a second end coupled to the thermal energy sink.

8. The system of claim 7, the one or more heat transfer devices each comprising a heat pipe.

9. The system of claim 7, the one or more of the base or the lid defining one or more mechanical connectors coupling the one or more heat transfer devices to the housing.

10. The system of claim 9, at least one mechanical connector of the one or more mechanical connectors comprising an aperture defined by the one or more of the base or the lid.

11. The system of claim 10, the aperture defining a threaded interior sidewall.

12. The system of claim 7, at least one heat transfer device of the one or more heat transfer devices passing through at least one aperture of the one or more apertures from an exterior of the housing to an interior of the housing.

13. The system of claim 12, further comprising at least one heat sink situated in the interior of the housing, wherein the first end of the at least one heat transfer device is coupled to the thermal energy sink and the second end of the at least one heat transfer device is coupled to the at least one heat sink.

14. The system of claim 6, wherein the another plurality of convection fins abuts the plurality of convection fins, thereby transferring the thermal energy generated by the one or more heat-generating electrical components from the housing to the thermal energy sink.

15. A system, comprising:
   a thermally-conductive housing comprising one or more heat-generating electrical components therein, wherein the thermally-conductive housing defines a plurality of convection fins dissipating thermal energy generated by the one or more heat-generating electrical components through the thermally-conductive housing;
   a thermal sink;
   one or more heat pipes thermally coupling the thermally-conductive housing to the thermal sink; and
   a thermal coupler disposed between at least one heat pipe of the one or more heat pipes and the thermally-conductive housing, the thermal coupler defining another plurality of convection fins mechanically engaging the plurality of convection fins of the thermally-conductive housing to transfer thermal energy generated by the one or more heat-generating electrical components from the thermally-conductive housing, through the thermal coupler, and to the thermal sink.

16. The system of claim 15, the thermally-conductive housing defining one or more mechanical receivers into which the one or more heat pipes are inserted.

17. The system of claim 15, the thermally-conductive housing comprising a base coupled to a lid to define a weather-proof thermally-conductive housing, wherein one or more of the base or the lid defines one or more apertures.

18. The system of claim 17, the one or more heat pipes passing through at least one aperture of the one or more apertures from the thermal sink, situated at an exterior of the thermally-conductive housing, to an interior of the thermally-conductive housing.

19. A method, comprising coupling one or more heat pipes between a housing and a thermal energy sink, the housing comprising one or more heat-generating electrical components therein and defining a plurality of convection fins dissipating thermal energy generated by the one or more heat-generating electrical components through the housing;
coupling a thermal coupler to at least one heat pipe; and
placing a thermal gap pad between the thermal coupler and the housing.

20. The method of claim 19, the housing defining one or more apertures, the method further comprising passing at least one heat pipe from an exterior of the housing to an interior of the housing.

* * * * *